US006543034B1

United States Patent
Goff et al.

(10) Patent No.: US 6,543,034 B1
(45) Date of Patent: Apr. 1, 2003

(54) MULTI-ENVIRONMENT TESTING WITH A RESPONDER

(75) Inventors: Lonnie C. Goff, Tempe, AZ (US); Brian D. Logsdon, Glendale, AZ (US); Edward M. Petryk, Fountain Hills, AZ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/997,764

(22) Filed: Nov. 30, 2001

(51) Int. Cl.[7] .............................................. G06F 17/50
(52) U.S. Cl. .............................................. 716/4; 716/5
(58) Field of Search ...................................... 716/1–14

(56) References Cited

U.S. PATENT DOCUMENTS

| 5,487,018 A | | 1/1996 | Loos et al. |
| 5,546,562 A | * | 8/1996 | Patel ........................... 703/14 |
| 5,559,715 A | | 9/1996 | Misheloff |
| 5,663,900 A | * | 9/1997 | Bhandari et al. ........... 364/378 |
| 5,692,160 A | | 11/1997 | Sarin |
| 5,726,902 A | | 3/1998 | Mahmood et al. |
| 5,826,073 A | * | 10/1998 | Ben-Meir et al. ........... 712/226 |
| 5,841,663 A | | 11/1998 | Sharma et al. |
| 5,926,629 A | * | 7/1999 | Gulick ........................ 710/117 |
| 6,006,022 A | | 12/1999 | Rhim et al. |
| 6,154,803 A | * | 11/2000 | Pontius et al. .............. 710/310 |
| 6,195,593 B1 | | 2/2001 | Nguyen |
| 6,240,543 B1 | | 5/2001 | Bhandan |
| 6,269,467 B1 | | 7/2001 | Chang et al. |
| 6,286,114 B1 | | 9/2001 | Veenstra et al. |

* cited by examiner

Primary Examiner—Matthew Smith
Assistant Examiner—Sun James Lin
(74) Attorney, Agent, or Firm—Peter Zawilski

(57) ABSTRACT

Among the embodiments of the present invention is test equipment (440) to test an integrated circuit (420). The integrated circuit (420) includes one or more processors and one or more communication devices (130). The test equipment (440) includes a responder integrated circuit (450) that has at least one processor, several communication devices (160), and one or more configuration connections (192). The responder integrated circuit responds to commands from the first integrated circuit (420) and a configuration established with the one or more configuration connections (192) to test operation of the one or more communication devices (130).

23 Claims, 4 Drawing Sheets

MULTI-ENVIRONMENT TESTING WITH A RESPONDER

BACKGROUND

The present invention relates to electronic devices, and more particularly, but not exclusively, relates to the simulation and testing of integrated circuitry.

Simulation, laboratory testing, and production testing are typical stages encountered during integrated circuit development and manufacture. Unfortunately, there is often little or no commonality in the code and/or test devices used in these different stages. In one scheme, laboratory testing makes no use of the code used to simulate integrated circuit designs, and this code finds only limited use in production testers often at slower speeds than typically desired. This situation can lead to difficulties in isolating design, validation, and/or production problems. With the continued increase in circuit complexity, including, but not limited to the development of "System-on-Chip" (SoC) technology, these difficulties have generally become more significant.

Thus, there is a need for further contributions in this area of technology. The present invention addresses this need.

SUMMARY

One embodiment of the present invention is a unique technique for simulating and/or testing circuitry. Other embodiments of the present invention include unique devices, methods, systems, and apparatus to simulate and/or test integrated circuits.

A further embodiment of the present invention includes designing an integrated circuit that has a communication device and simulating operation of the communication device with a model of the integrated circuit and a model of a responder circuit. The integrated circuit and responder circuits are fabricated based on these models and the integrated circuit is tested with the responder circuit. The models may be defined by a Hardware Description Language (HDL) or with the "C" programming language to name a few examples.

In another embodiment of the present invention, a simulation is conducted with a system-on-chip integrated circuit model and a responder integrated circuit model. A system-on-chip integrated circuit corresponding to the system-on-chip integrated circuit model and a responder integrated circuit corresponding to the responder integrated circuit model are provided. The system-on-chip integrated circuit is tested with the responder integrated circuit.

In still another embodiment, a computer-readable device carries instructions executable to provide a simulation of a SoC integrated circuit with a first integrated circuit model and a responder integrated circuit with a second integrated circuit model. The first model defines the SoC integrated circuit to include one or more processors and one or more communication devices and the second model defines the responder integrated circuit to include at least one processor and several communication interfaces. The instructions are further executable to simulate operation of the one or more communication devices with the responder integrated circuit being in a slave mode responsive to commands from the SoC integrated circuit.

One object of the present invention is to provide a unique technique for simulating and/or testing circuitry.

Another object of the present invention is to provide a unique device, method, system, or apparatus to simulate and/or test integrated circuits.

Further objects, embodiments, forms, features, benefits, and advantages of the present invention shall become apparent from the description and figures included herewith.

DETAILED DESCRIPTION OF SELECTED EMBODIMENTS

Figure 1:
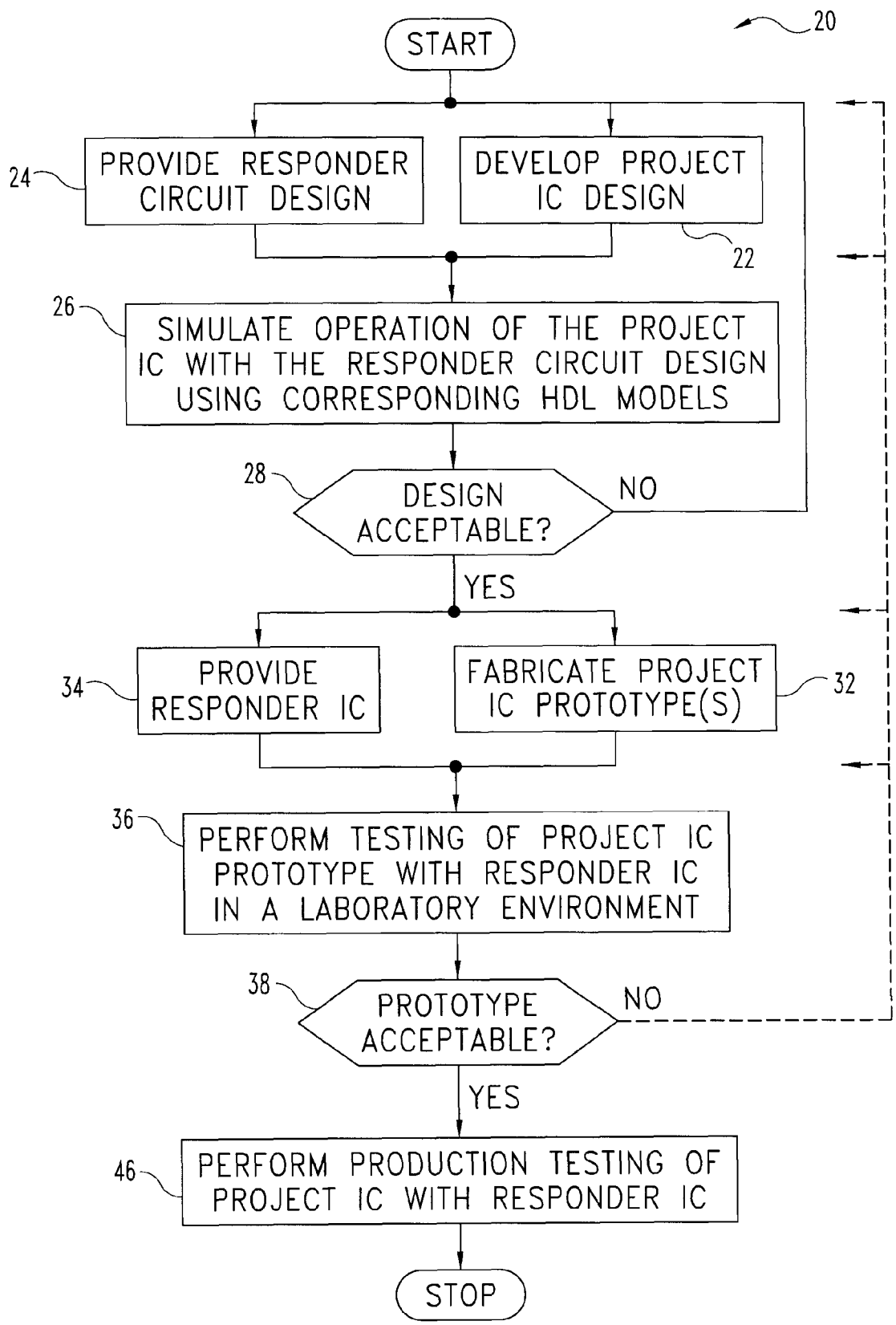
FIG. 1 is a flowchart illustrating an integrated circuit development process.

While the present invention may be embodied in many different forms, for the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

One embodiment of the present invention is a unique technique to simulate and test integrated circuitry. This technique can include providing a model of a responder integrated circuit to simulate communications with a model of a project integrated circuit under development, providing the responder integrated circuit and project integrated circuit, and testing the project integrated circuit with the responder integrated circuit. Further embodiments include other unique methods, systems, devices, or apparatus. By way of nonlimiting example, FIG. 1 diagrammatically depicts Integrated Circuit (IC) development process 20.

Process 20 begins with stages 22 and 24. In stage 22, a new project IC is designed. The project IC can be of a complex type, having a high degree of integration. Stage 22 includes providing a logical model for the project IC design that can be used to test the design through simulation. In one form, the design is specified by one or more Hardware Description Language (HDL) modules. These modules can be selected from a library to customize the cell array of an Application Specific Integrated Circuit (ASIC). One or more corresponding synthesis tools can be used to generate a netlist to embody the project IC design in the ASIC. U.S. Pat. No. 5,841,663 to Sharma et al. provides an example of this approach. In another embodiment, some or all modeling is provided with the "C" programming language. In other embodiments, the logical modeling of the project IC is of different type, and/or is only partially developed using ASIC technology or is developed in a fully customized manner without ASIC technology.

Figure 2:
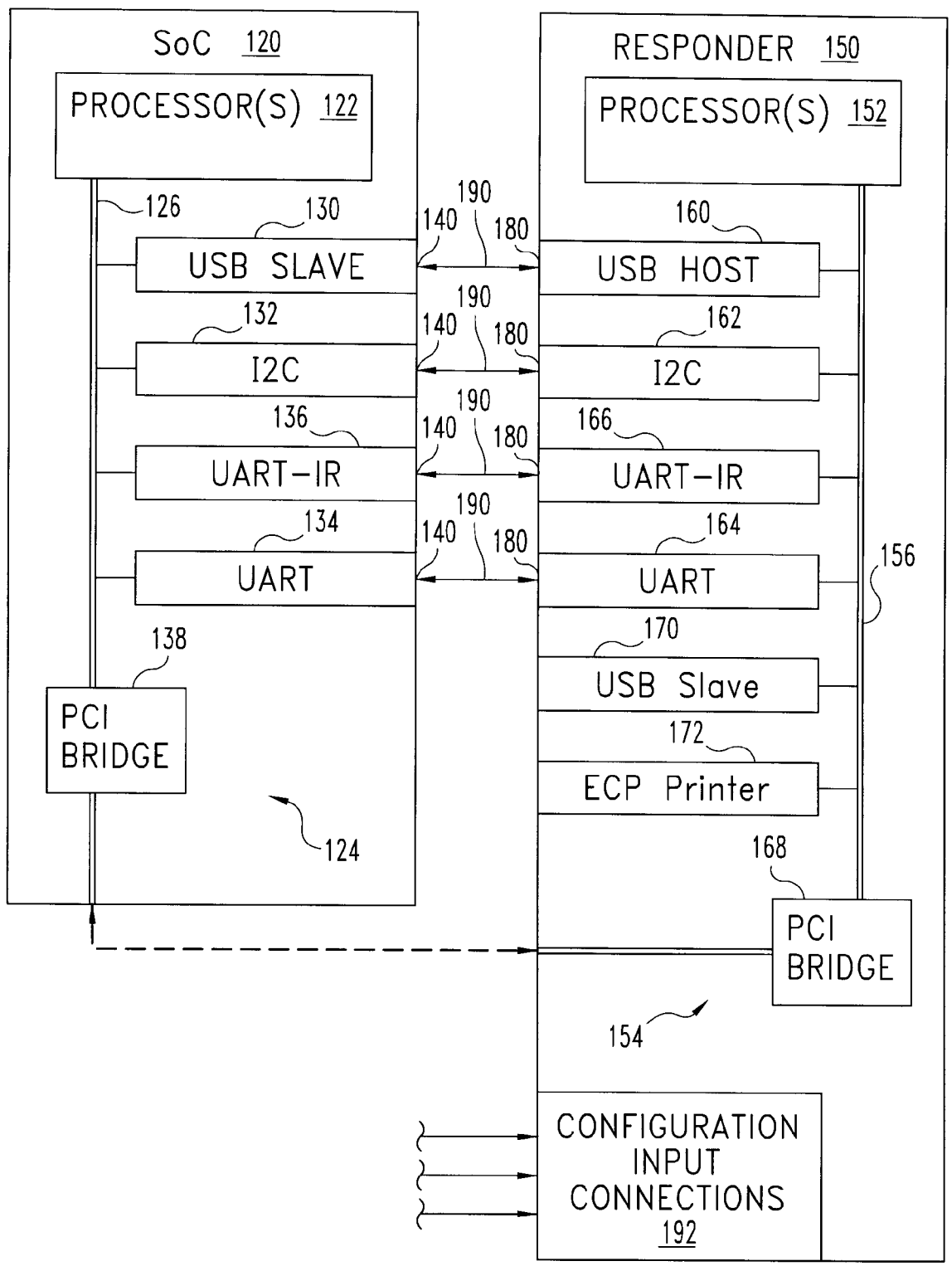
FIG. 2 is a schematic view of an integrated circuit arrangement that can be provided in accordance with the process of FIG. 1.

Referring additionally to FIG. 2, an example of a project IC design is schematically shown as System-on-Chip (SoC) 120. SoC 120 includes one or more processor(s) 122 coupled to a number of communication devices 124 by system bus 126. Communication devices 124 include Universal Serial Bus (USB) slave 130,12C (or I²C) device 132, Universal Asynchronous Receiver/Transmitter (UART) 134, UART InfraRed (UART-IR) 136, and PCI bus bridge 138. Communication devices 124 each have a corresponding communication interface 140. In other embodiments, more or fewer communication devices 124 are included and/or one or more different types of communication devices 124 are included as would occur to one skilled in the art. SoC 120 can include other devices such as one or more memories, clocks, caches, to name just a few.

In stage 24 of process 20, a responder circuit design is provided. This design is provided to interface with communication devices of the project IC design. The responder circuit design can be specified before, during, or after the project IC design in stage 22. It is envisioned that for selected project IC designs having a communication device subsystem of a previously developed IC, a previously developed responder circuit design could be utilized. Still, in other embodiments, the responder circuit design can be created as the project IC design is being created or subsequent to a given stage of the project design. In one preferred embodiment, the responder circuit design is in the form of an integrated circuit modeled in the same manner as the project IC design. In one more preferred embodiment, the responder circuit is integrated using one or more HDL modules common to the project IC design. Nonetheless, in still other embodiments, the form and/or modeling of the responder circuit can vary as would occur to one skilled in the art.

FIG. 2 provides one example of a responder circuit design as SoC responder 150. Responder 150 includes at least one processor 152 coupled to a number of communication devices 154 by system bus 156. Communication devices 154 include Universal Serial Bus (USB) Host 160,12C (or I²C) device 162, Universal Asynchronous Receiver/Transmitter (UART) 164, UART InfraRed (UART-IR) 166, and PCI bus bridge 168 each having one of communication interfaces 180 operatively coupled with a corresponding one of communication interfaces 140 of SoC 120 to provide a corresponding number of communication pathways 190. Such coupling can be mechanical, electrical, and/or optical as appropriate for the type of communication devices 124 and 154. Communication devices 154 also include USB slave 170 and ECP printer 172 that are not coupled to SoC 120. In other embodiments, more or fewer communication devices 154 are included and/or one or more different types of communication devices 154 are included as would occur to one skilled in the art. Responder 150 can include other devices such as one or more memories, clocks, caches, to name just a few.

Figure 3:
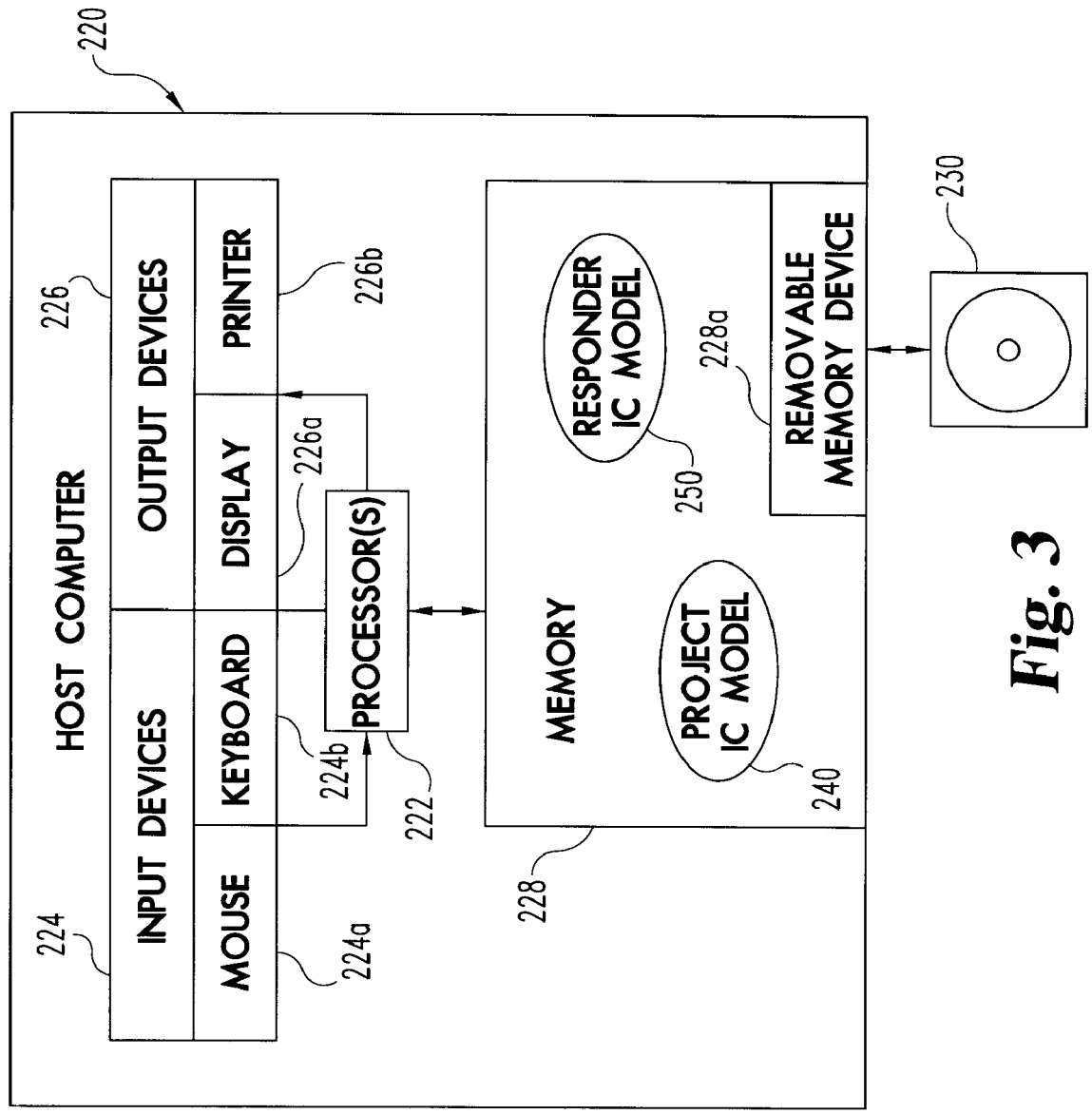
FIG. 3 is a diagrammatic view of a system for performing integrated circuit simulation in accordance with the process of FIG. 1.

Process 20 proceeds from stages 22 and 24 to stage 26. In stage 26, the project IC design is simulated with a host computer based on its logical modeling. This simulation includes testing communications with the responder circuit logical model. When desired, modeling communication devices for the project IC design and responder circuit design with the same code can typically provide a more accurate simulation relative to the application of different models. Referring to FIG. 3, simulation host computer 220 is shown with one or more processor(s) 222. Processor(s) 222 can be of any type. Computer 220 also includes operator input devices 224 and operator output devices 226 operatively coupled to processor(s) 222. Input devices 224 include a conventional mouse 224a and keyboard 224b, and alternatively or additionally can include a trackball, light pen, voice recognition subsystem, and/or different input device type as would occur to those skilled in the art. Output devices 226 include a conventional graphic display device 226a and printer 226b, and alternatively or additionally can include an aural output system, and/or different output device type as would occur to those skilled in the art. Further, in other embodiments, more or fewer operator input devices 224 or operator output devices 226 may be utilized.

Computer 220 also includes memory 228 operatively coupled to processor(s) 222. Memory 228 can be of one or more types, such as solid-state electronic memory, magnetic memory, optical memory, or a combination of these. As illustrated in FIG. 1, memory 228 includes a removable/portable memory device 228a that is symbolically shown with a removable storage disk 230. Storage disk 230 can be an optically-readable disk (such as a CD ROM or DVD) or a magnetically encoded hard disk or floppy disk. Alternatively or additionally, RMD 228a can include a magnetically encoded tape or cartridge media, a nonvolatile semiconductor configuration, or a different form of removable memory as would occur to those skilled in the art.

In one embodiment, at least a portion of memory 228 is operable to store programming instructions for processor(s) 222 to perform simulation in accordance with stage 26 of process 20. Project IC simulation model 240 and responder circuit model 250 are symbolically represented as information stored within memory 228. Computer 220 correspondingly executes models 240 and 250 to perform the simulation of stage 26. Letting models 320 and 350 represent SoC 120 and responder 150 of FIG. 2, respectively; simulation of stage 26 with computer 220 can be arranged to test communication between respective USB slave 130 and host 160, I2C bus devices 132 and 162, UART 134 and 164, UART-IR 136 and 166, and/or PCI bus bridge 138 and 168.

Alternatively or additionally, in a further embodiment of the simulated testing of stage 26, the responder IC logic model operates as a slave under the control of the project IC logic model. This embodiment includes a communication testing protocol that is provided through a communication medium operatively coupling the responder IC logic model and the project IC logic model. When more than one communication medium is present, a selection can be made with one or more dedicated configuration inputs to the responder circuit logic model. For the FIG. 2 example, configuration input connections 192 are illustrated to select among communication pathways 190. These connections can be provided in the form of general purpose Input/Output (I/O) pins of the responder IC. Alternatively or additionally, a default medium can be used. In those applications where a relatively simple, low overhead communication medium is desired, a UART communication link may be selected; however, in other embodiments with or without a UART link, a different medium or media could be used.

One nonlimiting example of a test protocol for the project IC model and responder circuit model is provided as follows in Table I:

TABLE I

| MASTER COMMAND | SLAVE FUNCTION |
| --- | --- |
| Reset | Slave responder performs a complete re-initialization. |
| Select Test | Specifies a test number to be executed and the number of times the test should be executed, building a Selected Test List. |
| Run Selected Tests | All tests previously selected by the Select Test command are executed. |

TABLE I-continued

| MASTER COMMAND | SLAVE FUNCTION |
| --- | --- |
| Halt All Tests | All test execution is terminated. The Selected Test List is cleared of all entries. |
| Halt Selected Test | The specified test is terminated and it is removed from the Selected Test List. |
| Read slave responder Status | The status of the slave responder is returned. |
| Read Selected Test Status | The status for the specified test is returned. |

For each row of Table I, the first column specifies commands sent by the project IC model and the second column specifies the corresponding function of the responder IC model in response to the first column command. In other embodiments, a different protocol and/or testing methodology can be alternatively or additionally utilized. In one such example, one or more general purpose Input/Output (I/O) pins are used to provide an interrupt protocol to synchronize the project IC and responder circuit models for testing.

It is anticipated that simulation executed in stage 26 could result in a desire to change the project IC and/or responder circuit design. Accordingly, conditional 28 tests if the simulated design is acceptable. If not, process 20 loops back to stage 22 and/or stage 24 to make desired design changes.

Once the design of the project IC and responder circuit have been acceptably tested, process 120 proceeds from the affirmative branch of conditional 28 to stages 32 and 34. One or more prototype project ICs are fabricated in stage 32 according to the accepted design. In stage 34, a responder IC is provided. Stage 34 can be executed before, during, or after stage 32. It is envisioned that a responder IC could be available from an earlier project IC design process that has the same communication device subsystems. In other cases, prototype responder ICs are fabricated.

Process 20 proceeds from stages 32 and 34 to stage 36 to perform testing in a laboratory environment. Stage 36 includes coupling the project IC and responder IC together to perform communication testing. This testing can generally duplicate testing performed during simulation in stage 26, including the testing protocol of Table I if desired. The responder IC can be provided in stand-alone laboratory test equipment.

From stage 36, process 20 continues with conditional 38 to determine whether the prototype is acceptable. If the test results are not acceptable, process 20 loops back to stages 22, 24, 26, 32, 34, and/or 36 as needed to address the unacceptable results. These options are represented by a dashed line having multiple arrowheads that extends from the negative branch of conditional 38. If the results are acceptable, then process 20 proceeds to stage 42 to produce the project IC. Stage 46 includes the performance of testing in a production environment with the responder IC. The responder IC is included in production test equipment for stage 46. As in the case of stage 36, stage 146 can be executed using the protocol of Table I if desired. Process 20 then halts. When desired, utilizing a responder IC for testing in stages 36 and 46 that corresponds to the responder circuit simulation model used in stage 26 can often provide a development process that is less problematic compared to other approaches.

Figure 4:
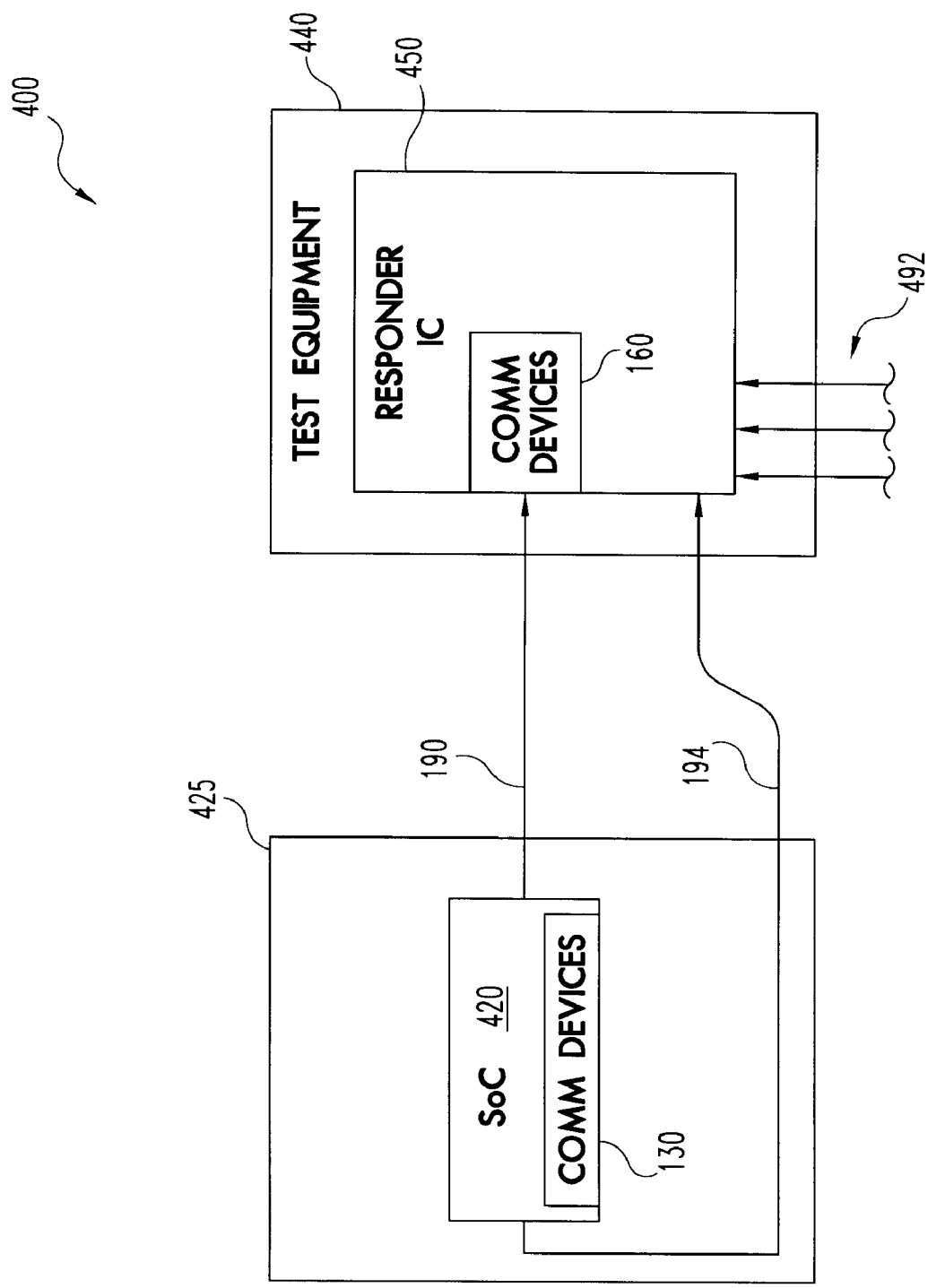
FIG. 4 is a diagrammatic view of a system to perform integrated circuit testing in accordance with the process of FIG. 1.

Referring to FIG. 4, test system 400 is illustrated, with like reference numerals representing like features of previously described embodiments. Test system 400 is representative of an arrangement that can be used to perform the testing of stage 36 and/or stage 46. System 400 includes a project IC in the form of SoC 420. SoC 420 is engaged to a test bed 425 for the purpose of conducting testing. SoC 420 is configured with the same devices as SoC 120, including communication devices 130 operatively coupled to test equipment 440 via communication pathways 490. Test equipment 440 includes responder IC 450 in the form of a Responder System-on-Chip (RSoC). Responder IC 450 can be configured the same as responder 150 and correspondingly includes communication devices 160 operatively coupled to SoC 420 via communication pathways 190. Responder IC 450 further includes configuration input connections 192 to select a communication media for testing control. In one embodiment, the testing protocol can be the same as that described in connection with Table I, through an interrupt synchronization technique, or with a different approach as would occur to one skilled in the art.

SoC 420 includes a general purpose Input/Output (I/O) connection 494 coupled to responder IC 450. I/O connections 494 can each be utilized to send a signal to selectively turn of one or more clocks of responder IC 450 (not shown) during simulation or physical testing of other devices and/or circuitry of SoC 420 (such as SoC memory testing, cache integrity validation, etc).

Many alternative embodiments of the present invention are contemplated. For example, in other embodiments, more than one project ICs/models can be tested and or simulated with a common responder IC/model. Additionally or alternatively, multiple responder ICs/models could be provided. In a further embodiment of a method according to the present invention, simulation may not be performed with a model of a responder IC. In still other method embodiments, testing with a responder IC may not be performed in both the laboratory environment and production environment. Another embodiment includes a computer operable to simulate operation of an IC design with a responder IC model. In further embodiments, a computer-readable device is provided carrying instructions executable to perform simulations with a responder circuit model, to conduct testing with a responder IC, or both. Another embodiment includes test equipment with a responder IC including at least some of the features of responder circuit logic models and/or responder ICs previously described. Another embodiment is a responder IC device.

Any theory, mechanism of operation, proof, or finding stated herein is meant to further enhance understanding of the present invention, and is not intended to limit the present invention in any way to such theory, mechanism of operation, proof, or finding. While the invention has been illustrated and described in detail in the drawings and foregoing description, the same is to be considered as illustrative and not restrictive in character, it being understood that only selected embodiments have been shown and described and that all equivalents, changes, and modifications that come within the spirit of the inventions as defined herein or by the following claims are desired to be protected.

What is claimed is:

1. A method, comprising:
designing an integrated circuit including a communication device;
simulating operation of the communication device with a model of the integrated circuit and a responder circuit model;
providing the integrated circuit based on the model and a responder integrated circuit based on the responder circuit model; and testing the integrated circuit with the responder integrated circuit.

2. The method of claim 1, wherein the integrated circuit design includes one or more other communication devices, said simulating including simulation of communications of the one or more other communication devices.

3. The method of claim 1, wherein the integrated circuit is of a system-on-chip type and the communication device is one of a group consisting of a universal serial bus host, a universal asynchronous receiver transmitter, and a bus bridge.

4. The method of claim 1, wherein said testing is performed in at least one of a laboratory environment and a production environment.

5. The method of claim 1, wherein the model of the integrated circuit and the responder circuit model are each at least partially defined by HDL.

6. The method of claim 1, which further includes sending test commands to the responder integrated circuit from the integrated circuit to operate the responder integrated circuit in a slave mode during said testing.

7. A method, comprising:
conducting a simulation with an SoC integrated circuit model and a responder integrated circuit model;
providing an SoC integrated circuit corresponding to the SoC integrated circuit model and a responder integrated circuit corresponding to the responder integrated circuit model; and
testing the SoC integrated circuit with the responder integrated circuit.

8. The method of claim 7, wherein the SoC integrated circuit includes one or more processors and one or more communication devices and the responder integrated circuit includes at least one processor and several communication devices.

9. The method of claim 7, wherein said conducting includes testing communication operations of the SoC integrated circuit with the simulation.

10. The method of claim 7, wherein said testing includes testing the SoC integrated circuit in a laboratory environment and testing the SoC integrated circuit in a production environment.

11. The method of claim 7, which further includes configuring the responder integrated circuit with one or more configuration connections.

12. Apparatus, comprising:
test equipment to test an SoC integrated circuit including one or more processors and one or more communication devices, the test equipment including a responder integrated circuit, the responder integrated circuit including at least one processor, several communication interfaces, and one or more configuration connections, the responder integrated circuit being responsive to commands from the SoC integrated circuit and a configuration established with the one or more configuration connections to test the one or more communication devices of the SoC integrated circuit.

13. The apparatus of claim 12, further comprising a computer operable to simulate the SoC integrated circuit with a first HDL model and the responder integrated circuit with a second HDL model.

14. The apparatus of claim 12, further comprising the SoC integrated circuit operatively coupled to the test equipment.

15. The apparatus of claim 12, wherein the one or more processors and the one or more communication devices are coupled to a system bus, and the one or more communication devices are each one of a group consisting of a universal serial bus host, a universal asynchronous receiver transmitter, and a bus bridge.

16. The apparatus of claim 12, wherein the communication interfaces each correspond to one of a group consisting of a universal serial bus slave, a universal asynchronous receiver transmitter, and a bus bridge.

17. The apparatus of claim 16, wherein the responder integrated circuit further includes an I2C device.

18. Apparatus comprising: a computer-readable device carrying instructions executable to provide a simulation of an SoC integrated circuit with a first HDL integrated circuit model and a responder integrated circuit with a second HDL integrated circuit model, the first HDL integrated circuit model defining the SoC integrated circuit to include one or more processors and one or more communication devices and the second HDL integrated circuit model defining the responder integrated circuit to include at least one processor and several communication interfaces, the instructions being further executable to simulate operation of the one or more communication devices with the responder integrated circuit.

19. The apparatus of claim 18, wherein the computer-readable device is in the form of a storage disk.

20. The apparatus of claim 18, further comprising a computer operable to execute the instructions to perform the simulation.

21. The apparatus of claim 18, further comprising test equipment including a responder integrated circuit provided in accordance with the second HDL model.

22. The apparatus of claim 18, wherein the one or more communication devices include at least one of a group consisting of a universal serial bus host, a universal asynchronous receiver transmitter, an I2C device, and a bus bridge.

23. The apparatus of claim 18, wherein the instructions are further operable to simulate operation of the responder integrated circuit in a slave mode in responsive to the SoC.

* * * * *